United States Patent
Ogata et al.

(10) Patent No.: US 9,082,730 B2
(45) Date of Patent: Jul. 14, 2015

(54) ORGANIC EL DISPLAY UNIT AND ORGANIC EL DISPLAY DEVICE

(75) Inventors: Hidenori Ogata, Osaka (JP); Yoshimasa Fujita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/976,014

(22) PCT Filed: Dec. 27, 2011

(86) PCT No.: PCT/JP2011/080225
§ 371 (c)(1),
(2), (4) Date: Jul. 30, 2013

(87) PCT Pub. No.: WO2012/091018
PCT Pub. Date: Jul. 5, 2012

(65) Prior Publication Data
US 2013/0299804 A1    Nov. 14, 2013

(30) Foreign Application Priority Data

Dec. 28, 2010    (JP) .................... 2010-293302

(51) Int. Cl.
*H01L 35/24* (2006.01)
*H01L 51/00* (2006.01)
(Continued)

(52) U.S. Cl.
CPC .......... *H01L 27/3244* (2013.01); *H01L 27/322* (2013.01); *H01L 27/3293* (2013.01); *H01L 51/524* (2013.01); *H01L 51/56* (2013.01); *H01L 27/3276* (2013.01); *H01L 51/52* (2013.01)

(58) Field of Classification Search
CPC ............ H01L 51/0545; H01L 51/0036; H01L 51/0541; H01L 51/5012
USPC .............................................. 257/40; 438/35
See application file for complete search history.

(56) References Cited

U.S. PATENT DOCUMENTS 8,604,490 B2 * 12/2013 Yuasa ............................. 257/88
2004/0051451 A1    3/2004 Kawase et al.
(Continued)

FOREIGN PATENT DOCUMENTS

JP    2004-111059 A    4/2004
JP    2004-191608 A    7/2004
(Continued)

OTHER PUBLICATIONS

International Search Report received for PCT Patent Application No. PCT/JP2011/080225, mailed on Apr. 17, 2012, 8 pages (4 pages of English Translation and 4 pages of PCT Search Report).
(Continued)

*Primary Examiner* — Phuc Dang
(74) *Attorney, Agent, or Firm* — Morrison & Foerster LLP

(57) ABSTRACT

An organic EL display unit is an organic EL display unit which includes a first substrate; an organic EL element which is located on the first substrate, which includes a first electrode, an organic layer containing at least an organic light emitting layer, and a second electrode, and which is configured to emit excitation light; a second substrate; and an optical conversion layer which is located on the second substrate and which is configured to emit light to the outside through a display surface, the light being obtained by conversion of a color tone of the excitation light, the display surface is flat and rectangular, and the second substrate is divided into a plurality of sections along a long side direction of the display surface.

14 Claims, 4 Drawing Sheets

(51) Int. Cl.
*H01L 27/32* (2006.01)
*H01L 51/52* (2006.01)
*H01L 51/56* (2006.01)

(56) References Cited

U.S. PATENT DOCUMENTS

| | | |
|---|---|---|
| 2005/0253881 A1 | 11/2005 | Murayama et al. |
| 2010/0006969 A1* | 1/2010 | Park et al. ............... 257/446 |
| 2011/0037732 A1* | 2/2011 | Takama et al. ............ 345/175 |

FOREIGN PATENT DOCUMENTS

| | | |
|---|---|---|
| JP | 2005-349381 A | 12/2005 |
| JP | 2006-164618 A | 6/2006 |
| JP | 2008-146856 A | 6/2008 |

OTHER PUBLICATIONS

Shim et al., "Simulation Study for Seamless Imaging of OLED Tiled Display", IDW '08, OLED3-4, Reformable Display Group, Samsung Electronics, Republic of Korea, 2008, pp. 173-176.

* cited by examiner

ORGANIC EL DISPLAY UNIT AND ORGANIC EL DISPLAY DEVICE

CROSS REFERENCE TO RELATED APPLICATIONS

This is a National Phase patent application of PCT/JP2011/080225, filed Dec. 27, 2011, which claims priority to Japanese patent application no. 2010-2993302 filed Dec. 28, 2010, each of which is hereby incorporated by reference in the present disclosure in its entirety.

TECHNICAL FIELD

The present invention relates to an organic EL display unit, an organic EL display device using organic EL display units, each of which is described above, and a method for manufacturing an organic EL display unit.

This application claims priority from Japanese Patent Application No. 2010-293302 filed Dec. 28, 2010, which is hereby incorporated by reference herein in its entirety.

BACKGROUND ART

In recent years, concomitant with the trend toward advanced information performance, flat panel displays have been increasingly needed. For example, a non-self-luminous liquid crystal display (LCD), a self-luminous plasma display (PDP), an inorganic electroluminescence (inorganic EL) display, and an organic electroluminescence (hereinafter referred to as "organic EL") display have been known. In particular, among those flat panel displays, the organic EL display has been significantly advanced.

In the organic EL display, there has been known a technique performing movie display by a simple matrix drive or a technique performing movie display by an active matrix drive of organic EL elements using thin film transistors (TFTs).

In addition, in a related display, pixels emitting red (R), green (G), and blue (B) light are used as one unit, and those pixels are arranged in a two-dimensional manner, so that many types of light having various color tones, such as white light, are produced to perform a full color display.

In order to realize the full color display as described above, in the case of organic EL, a method has been generally performed in which red, green, and blue pixels are separately formed from corresponding organic light emitting layers by a mask deposition method using a shadow mask. However, in the method as described above, it has been difficult to achieve an improvement in processing accuracy of the mask, an improvement in alignment accuracy of the mask, and an increase in size of the mask. In particular, in a large display field including a flat-screen television as a representative example, the size of a substrate has been increased from G6 to G8 and G10. Accordingly, in a related manufacturing method, a mask having a size approximately equivalent to or larger than that of the substrate is required, and as a result, it is necessary to form a mask corresponding to a large substrate.

Since the mask as described above requires a very thin metal (having a thickness, for example, of 50 to 100 nm), it is difficult to form a mask corresponding to a large substrate. Degradation in processing accuracy of the mask and alignment accuracy of the evaporation equipment may cause mixing among different types of emission light due to light emitting layers overlapped with each other. In order to prevent the phenomenon described above, in general, insulating layers of a specific width are required to be provided between pixels. However, when the area of each pixel is limited, the area of a light emitting portion or aperture ratio of the pixel is decreased, therefore, luminance may be lowered, power consumption increased, and lifetime decreased.

In addition, in the related manufacturing method, an organic layer is deposited in an upward direction using an organic material deposition source disposed below a substrate. Hence, as the size of the substrate (the size of the mask) is increased, the mask warps at a central portion thereof. The warp of the mask may be responsible in some cases for the mixing among different types of emission light described above. In an extreme example, a portion at which no organic layer is formed is unfavorably generated, and as a result, a leak may occur between an upper electrode and a lower electrode. In addition, in the related manufacturing method, since the mask is degraded when used a predetermined number of times, the mask may not be further used. Hence, the increase in size of the mask results in an increase in manufacturing cost of displays.

In order to overcome various phenomena in the large organic EL display as described above, a method has been proposed in which a plurality of organic EL displays (organic EL display units) are arranged to form one large display as a whole. However, when a plurality of organic EL display units are used in combination, a seam formed between organic EL display units arranged adjacent to each other becomes conspicuous, and the display quality as the display is degraded.

As a method to solve the problem relating to gaps formed when a plurality of organic EL display units are arranged in combination to realize one large organic EL display as a whole, for example, a method has been proposed in which at the expense of the aperture ratio, four organic EL panels are further sealed from the rear sides thereof to eliminate the seams (for example, see PTL 1).

In addition, a method has also been proposed in which after sealing portions of two organic EL panels are arranged so as to be overlapped with each other, an optically transparent plate having an adjusted refractive index is adhered to a substrate forming one of the two panels to eliminate the seam (for example, see NPL 1).

CITATION LIST

Patent Literature

PTL 1: Japanese Unexamined Patent Application Publication No. 2004-111059

Non-Patent Literature

NPL 1: International Display Workshops 08 173-176

SUMMARY OF INVENTION

Technical Problem

In the display disclosed in PTL 1, among four sides of each of the display units which are arranged in combination, terminals are required to be taken out of at least two sides orthogonal to each other to drive each display unit.

In general, since a FPC (flexible printed circuit) is pressure-bonded to the two orthogonal sides to form a connection to a drive circuit side, it is impossible to form a display having no seams by close contact of the two orthogonal sides with other display units. Accordingly, in the invention disclosed in PTL 1, only in the case of four panels, FPCs can be connected to the two sides of each panel, so they are arranged in combination to form one display most effectively.

On the other hand, according to NPL 1, two panels are arranged in combination to form one display.

However, in the displays disclosed in PTL 1 and NPL 1, when at least five display units are used in combination, a method to input a drive signal to a display unit located at the center has not been disclosed, and as a result, at most four display units can be used in combination. Hence, in order to realize a larger display, the size of each of display units to be used in combination is inevitably increased.

In consideration of the above problem, an object of one aspect of the present invention is to provide an organic EL display unit which can realize high-quality display characteristics in such a way that even if a large display is formed by arrangement of many display units, gaps formed between adjacent display units are each made to be inconspicuous and to provide an organic EL display device using organic EL display units, each of which is described above.

In addition, another object is to provide a method for manufacturing an organic EL display unit which is able to make gaps to be inconspicuous, the gaps being formed between adjacent display units when many display units are arranged.

Solution to Problem

In order to solve the above problem, several aspects of the present invention provide the following organic EL display unit, organic EL display device, and method for manufacturing an organic EL display unit.

That is, an organic EL display unit according to one aspect of the present invention comprises: a first substrate; an organic EL element which is located on the first substrate, which includes a first electrode, an organic layer at least containing an organic light emitting layer, and a second electrode, and which is configured to emit excitation light; a second substrate; and an optical conversion layer which is located on the second substrate, and which is configured to emit light to the outside through a display surface, the light being obtained by conversion of a color tone of the excitation light. In this organic EL display unit, the display surface is flat and rectangular, and the second substrate is divided into a plurality of sections along a long side direction of the display surface.

The first substrate extends along the long side direction of the display surface and has a first end portion bent in a direction toward a surface opposite to the display surface, and the first substrate may further comprise a first connection terminal portion on a surface of the first end portion opposite to the display surface, the first connection terminal portion performing an input of a control signal of the organic EL display unit.

The optical conversion layer may be formed by fluorescent substance which performs fluorescence conversion of the excitation light.

In addition, the organic light emitting layer may emit white light, and the optical conversion layer may be a color filter converting a color tone of the white light.

The first connection terminal portion may be formed in a region which is not overlapped with the second substrate.

In addition, the first substrate and the second substrate may be formed of a material containing a metal or a resin.

An active matrix drive element corresponding to the organic EL element may also be arranged.

In addition, a second connection terminal portion extending along a short side direction of the display surface may also be further formed.

A plurality of fluorescent substance layers, each of which is described above, may be formed on the second substrate, the plurality of fluorescent substance layers may include a red fluorescent substance layer, a green fluorescent substance layer, and a blue fluorescent substance layer, and the red fluorescent substance layer, the green fluorescent substance layer, and the blue fluorescent substance layer each may be arranged in parallel along the long side direction of the display surface.

In addition, a plurality of color filters, each of which is described above, may be formed on the second substrate, the plurality of color filter layers may include a red color filter layer, a green color filter layer, and a blue color filter layer, and the red color filter layer, the green color filter layer, and the blue color filter layer each may be arranged in parallel along the long side direction of the display surface.

The first substrate may be formed of an iron-nickel-based alloy having a linear expansion coefficient of $1 \times 10^{-5}/°$ C. or less.

The organic EL display device according to one aspect of the present invention is formed by arranging a plurality of organic EL units, each of which is described in each of the above paragraphs, along the short side direction of the display surface.

In a first organic EL display unit among the plurality of organic EL display units, one end portion along the long side direction of the display surface may be in contact with a second organic EL display unit at the display surface side thereof, the second organic EL display unit being adjacent to the first organic EL display unit, and another end portion along the long side direction of the display surface may be in contact with a third organic EL display unit at the rear surface side thereof, the third organic EL display unit being adjacent to the first organic EL display unit.

According to one aspect of the present invention, there is provided a method for manufacturing an organic EL display unit comprising a first substrate; an organic EL element which is located on the first substrate, which includes a first electrode, an organic layer at least containing an organic light emitting layer, and a second electrode, and which is configured to emit excitation light; a second substrate; and an optical conversion layer which is located on the second substrate and which is configured to emit light to the outside through a display surface, the light being obtained by conversion of a color tone of the excitation light, the display surface being flat and rectangular, the first substrate extending along a long side direction of the display surface and having a first end portion bent to protrude in a direction toward a surface opposite to the display surface, the first end portion being provided with a first connection terminal portion which inputs a control signal of the organic EL display unit on the surface opposite to the display surface, and the second substrate being divided into a plurality of sections along the long side direction of the display surface. The method described above comprises forming the organic layer using a linear deposition head arranged to extend along a short side direction of the display surface while the first substrate is conveyed along the long side direction of the display surface.

In addition, the method may further comprise forming the optical conversion layer on the second substrate by a roll-to-roll method.

Advantageous Effects of Invention

According to the aspect of the present invention, an organic EL display unit which can make gaps to be inconspicuous, the gaps being formed between adjacent display units when many display units are arranged, and an organic EL display device can be provided.

DESCRIPTION OF EMBODIMENTS

Figure 1:
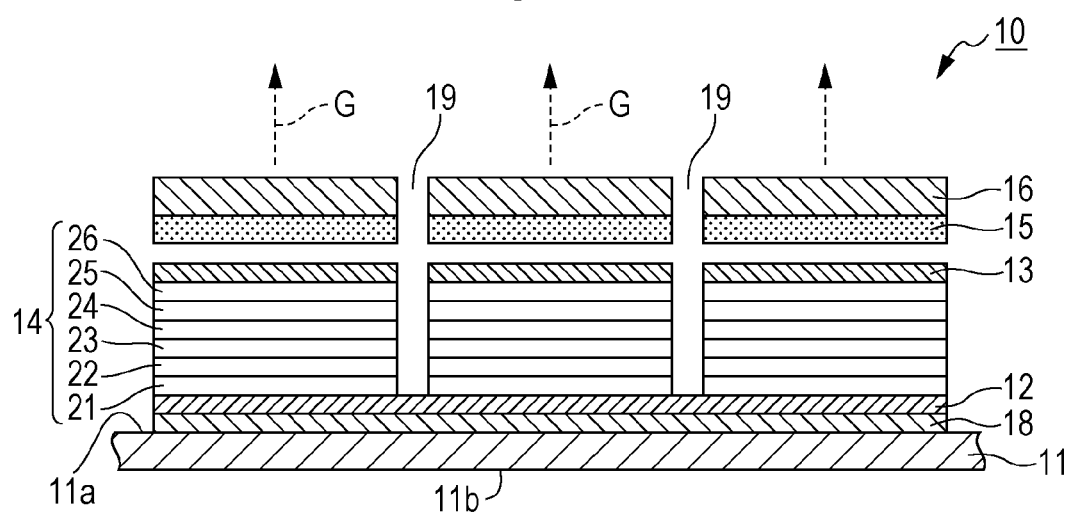
FIG. 1 is a cross-sectional view showing an organic EL display unit of the present invention.

Hereinafter, with reference to the drawings, an embodiment of an organic EL display unit and an embodiment of an organic EL display device using the same, each according to one aspect of the present invention, will be described. Incidentally, the following embodiments will be described in order to promote more understanding of the points of the aspect of the present invention, and unless otherwise particularly described, the aspect of the present invention is not limited. In addition, in the drawings used for the following illustration, in order to promote understanding of features of the aspect of the present invention, for convenience, a portion functioning as a critical portion may be enlarged and shown in some cases, and the dimensional ratios between constituent elements are not always equal to the actual ratios.

Figure 2:
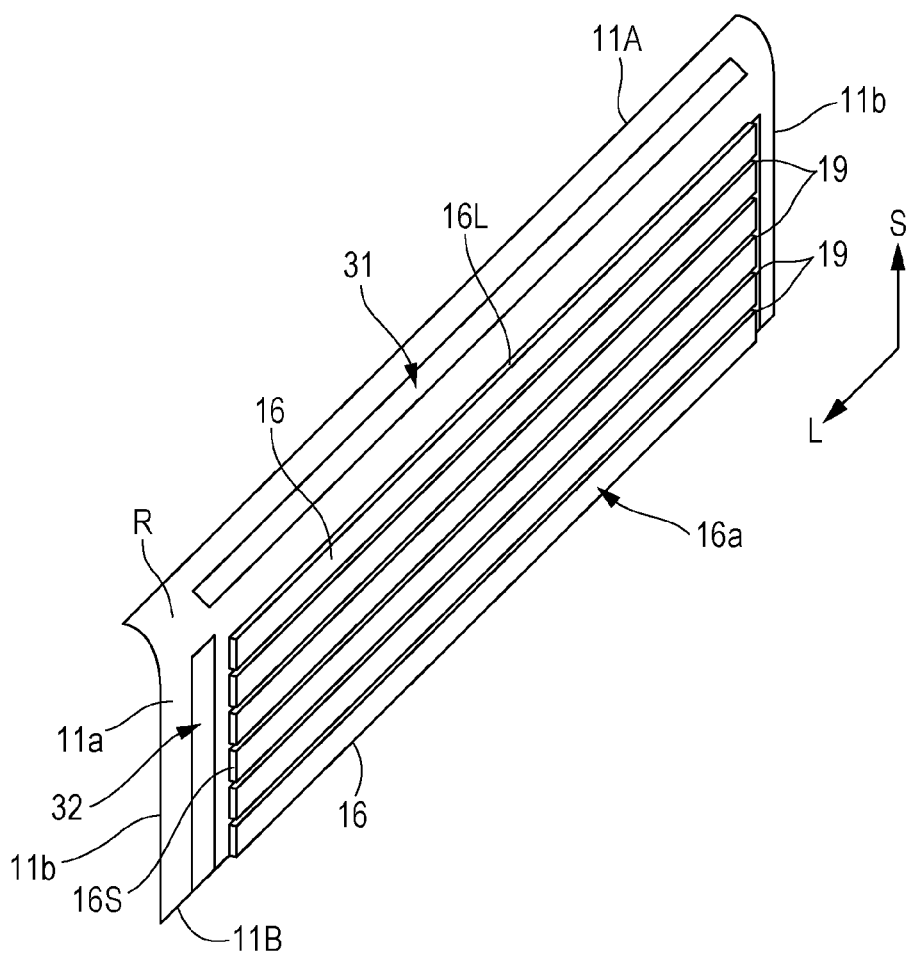
FIG. 2 is an external perspective view showing the organic EL display unit of the present invention.

FIG. 1 is a cross-sectional view showing one example of an organic EL display unit according to an embodiment of the present invention. In addition, FIG. 2 is a partially enlarged cross-sectional view of this organic EL display unit along a short side direction thereof.

An organic EL display unit 10 has a first substrate 11, a first electrode 12, a second electrode 13, and an organic layer (organic EL layer) 14. The first electrode 12 is laminated on one surface 11a of the first substrate 11. The organic layer (organic EL layer) 14 is provided between the first electrode 12 and the second electrode 13. In addition, over the second electrode 13, a second substrate (sealing substrate) 16 provided with an optical conversion layer 15 is formed.

The organic layer (organic EL layer) 14 is formed of a hole injection layer 21, a hole transport layer 22, an organic light emitting layer 23, a hole blocking layer 24, an electron transport layer 25, and an electron injection layer 26 in this order from the side in contact with the first electrode 12.

In addition, on the surface 11a of the first substrate 11, an active drive element 18 is preferably formed. The active drive element 18 as described above is an element to drive the organic light emitting layer 23 and may be, for example, a TFT.

The optical conversion layer 15 may be formed, for example, of fluorescent substance which is excited with excitation light emitted from the organic layer (organic EL layer) 14 and which emits fluorescent light (image light) in a wavelength region corresponding to one of RGB. For example, when used for an organic EL unit performing full color display, the optical conversion layer 15 may be formed of fluorescent substance of three primary colors, that is, blue fluorescent substance, green fluorescent substance, and red fluorescent substance.

Alternatively, the optical conversion layer 15 may be, for example, a color filter which performs color conversion of white light (excitation light) emitted from the organic layer (organic EL layer) 14 into light (image light) in a wavelength region corresponding to one of RGB.

The organic layer (organic EL layer) 14 which emits the excitation light for the optical conversion layer 15 as described above emits light when a predetermined voltage is applied between the first electrode 12 and the second electrode 13. For example, when the optical conversion layer 15 is a fluorescent substance layer, the organic layer (organic EL layer) 14 emits light in a wavelength region which excites the fluorescent substance. In addition, when the optical conversion layer 15 is a color filter, the organic layer (organic EL layer) 14 emits white light.

Image light (emitted light) G obtained by light conversion using the optical conversion layer 15 as described above is emitted from one surface of the second substrate (sealing substrate) 16, that is, from a display surface 16a. The display surface 16a of the organic EL display unit 10 has a flat surface and also has a rectangular shape defined by a short side 16S and a long side 16L.

In addition, the second substrate (sealing substrate) 16 is divided into a plurality of sections along a direction (hereinafter referred to as "long side direction L") parallel to the long side 16L of the display surface 16a by narrow groove portions 19. That is, in contrast with the first substrate 11 formed of one plate, the second substrate (sealing substrate) 16 is divided into at least two sections by at least one groove portion 19. For example, in this embodiment, the second substrate (sealing substrate) 16 is divided into six sections.

In addition, the fluorescent substance layer or the color filter, each forming the optical conversion layer 15, may have the following structure. For example, in each of the sections formed by dividing the second substrate (sealing substrate) 16 along the long side direction L, RGB colors each forming the fluorescent substance layer or the color filter may be arranged in parallel along the long side direction L. For example, the fluorescent substance layer may include a red fluorescent substance layer, a green fluorescent substance layer, and a blue fluorescent substance layer, and the red fluorescent substance layer, the green fluorescent substance layer, and the blue fluorescent substance layer each may be arranged in parallel along the long side direction of the display surface. In addition, the color filter may include a red color filter, a green color filter, and a blue color filter, and the red color filter, the green color filter, and the blue color filter each may be arranged in parallel along the long side direction of the display surface.

In the first substrate 11, one end portion 11A along the long side direction L is bent toward a rear surface 11b which is a surface opposite to the display surface 16a. That is, the end portion 11A is formed to protrude in a direction toward this rear surface 11b. This end portion 11A of the first substrate 11 may be formed, for example, to have a curved surface R bent approximately 45° with respect to the rear surface 11b.

In addition, on the bent end portion 11A of this first substrate 11, that is, on the curved surface R, a first connection terminal portion (H scan) 31 which inputs a control signal of the organic EL display unit 10 is formed to extend along the long side direction L. To the first connection terminal portion 31, a connector which inputs an input signal of an image to be displayed on the display surface 16a is connected. Alternatively, the end portion 11A of the first substrate 11 may have a structure in which a control signal is input from the rear surface 11b of the first substrate 11 without particularly curving the end portion 11A of the first substrate 11.

On the other hand, in the first substrate 11, on one of two side regions (regions each located between the short side 16S and a corresponding end portion of the first substrate 11) extending along a direction parallel with the short side 16S of the display surface 16a, a second connection terminal portion (V scan) 32 is further formed. Alternatively, to the second connection terminal portion 32 as described above, a connector which inputs an input signal of an image to be displayed on the display surface 16a may be connected.

Hereinafter, although constituent members forming the organic EL display unit 10 according to the aspect of the present invention and respective formation methods of the constituent members will be described in detail, the aspect of the present invention is not limited to the constituent members and the formation methods thereof.

As the first substrate 11, for example, there may be mentioned insulating substrates including an inorganic material substrate of glass, quartz, or the like, a plastic substrate of a poly(ethylene terephthalate), a polycarbazole, a polyimide, or the like, or a ceramic substrate of alumina, or the like; a metal substrate of aluminum (Al), iron (Fe), or the like; a substrate formed by coating an insulating material, such as silicon oxide ($SiO_2$), an organic insulating material, or the like, on a surface of the substrate mentioned above; and a substrate formed by performing an insulation treatment by a method, such as anode oxidation, on a surface of a metal substrate of Al or the like. However, this embodiment is not limited to those substrates.

In particular, in order to form the curved surface R curved toward a rear surface 11b side by bending the end portion 11A of the first substrate 11 without applying stress thereto, as the first substrate 11, a plastic substrate or a metal substrate is preferably used. In addition, a substrate formed by coating an inorganic material on a plastic substrate and a substrate formed by coating an inorganic insulating material on a metal substrate are more preferable.

Accordingly, it becomes possible to solve degradation of the organic layer (organic EL layer) 14 (it has been known that the organic EL layer is liable to be degraded, in particular, even by a small amount of moisture), the degradation being caused by moisture permeation which occurs when a plastic substrate is used as the first substrate 11 of the organic EL display unit 10.

In addition, when a metal substrate is used as the first substrate 11, since the film thickness of the organic layer 14 is very thin, such as approximately 100 to 200 nm, a projection of the surface of the metal substrate causes leakage current at a pixel portion. A plastic substrate can prevent such leakage current.

In addition, when the active drive element (TFT) 18 is formed on the surface 11a of the first substrate 11, the first substrate 11 which is neither melted nor deformed, for example, at the temperature lower than 500° C. is preferably used. In addition, in general, since the thermal expansion coefficient of a metal substrate is different from that of a glass substrate, by a related production machine, it has been difficult to form a TFT on a metal substrate.

Hence, when a metal substrate formed from an iron-nickel-based alloy having a linear expansion coefficient of $1 \times 10^{-5}/°$ C. or less is used as the first substrate 11, the linear expansion coefficient thereof can be made coincide with that of a glass, and as a result, a TFT can be formed on the metal substrate at a low cost using a related production machine.

In addition, when a plastic substrate is used as the first substrate 11, a heat resistant temperature thereof is low. Hence, a TFT is first formed on a glass substrate and is then transferred on a plastic substrate, so that the TFT can be formed on the plastic substrate by transfer.

In the structure in which light is emitted to the outside from the organic layer 14 through the second substrate (sealing substrate) 16 facing the first substrate 11, the optical transparency of the first substrate 11 is not restricted. On the other hand, when light is emitted from the organic layer 14 through the rear surface 11b side of the first substrate 11, a transparent or a semi-transparent substrate is required to be used as the first substrate 11.

Since light emitted from the organic layer 14 or light from the optical conversion layer 15 is required to pass through the second substrate (sealing substrate) 16, the second substrate (sealing substrate) 16 is required to be formed from a material which can allow light beams in respective wavelength regions to pass therethrough. When a fluorescent substance layer or a color filter layer is formed as the optical conversion layer 15, as a method for manufacturing the second substrate (sealing substrate) 16, manufacturing by a roll-to-roll method is preferable. In this case, as the second substrate (sealing substrate) 16, although a flexible plastic substrate formed from a poly (ethylene terephthalate), a polycarbazole, a polyimide, or the like is preferable, this embodiment is not limited to those materials mentioned above.

The active drive element (TFT) 18 formed on the surface 11a of the first substrate 11 is formed in advance on the first substrate 11 before the organic layer 14 is formed. The active drive element (TFT) 18 functions as a switch and a drive element. As the TFT used in this embodiment, a known TFT may be mentioned. In addition, instead of using the TFT, a metal-insulator-metal (MIM) diode may also be used.

A TFT to be preferably used in an active drive organic EL display unit, which is one example of an organic EL display unit 10, and in an organic EL display device formed in combination of the above display units can be formed using known materials, structures, and formation methods.

As a material for an active layer of the TFT, for example, there may be mentioned an inorganic semiconductor material, such as noncrystalline silicon (amorphous silicon), polycrystalline silicon (polysilicon), microcrystalline silicon, or cadmium selenide; an oxide semiconductor material, such as zinc oxide or indium oxide-gallium oxide-zinc oxide; or an organic semiconductor material, such as a polythiophene derivative, a thiophene oligomer, a poly(p-phenylene vinylene) derivative, naphthacene, or pentacene. In addition, as the structure of the TFT, for example, a staggered, a reverse staggered, a top gate, and a coplanar type may be mentioned.

As a method for manufacturing a TFT, for example, there may be mentioned (1) a method in which an impurity is ion-doped in an amorphous silicon film formed by a plasma enhanced chemical vapor deposition (PECVD) method, (2) a method in which after amorphous silicon is formed by a low pressure chemical vapor deposition (LPCVD) method using a silane ($SiH_4$) gas and is then crystallized into polysilicon by a solid-phase growth method, ion doping is performed by a ion implantation method, (3) a method (low temperature process) in which after amorphous silicon is formed by a LPCVD method using a $Si_2H_6$ gas or a PECVD method using a $SiH_4$ gas and is then crystallized into polysilicon by annealing using a laser such as an excimer laser, ion doping is performed, (4) a method (high temperature process) in which after a polysilicon layer is formed by a LPCVD method or a PECVD method and is then thermal-oxidized at 1,000° C. or more to form a gate insulating film, and a gate electrode of $n^+$ polysilicon is formed thereon, ion doping is performed, (5) a method in which an organic semiconductor film is formed, for example, by an ink jet method, and (6) a method in which a single crystalline film of an organic semiconductive material is obtained.

The gate insulating film of the TFT can be formed using a known material. For example, $SiO_2$ formed by a PECVD method, a LPCVD method, or the like or $SiO_2$ obtained by thermal oxidation of a polysilicon film may be mentioned. In addition, a signal electrode line, a scanning electrode line, a common electrode line, a first drive electrode, and a second drive electrode of the TFT each may be formed using a known material, and for example, tantalum (Ta), aluminum (Al), and copper (Cu) may be mentioned.

In addition, although the active drive element (TFT) 18 of this embodiment can be formed to have the structure as described above, this embodiment is not limited to those materials, structures, and formation methods described above.

Between the active drive element (TFT) 18 and the organic layer 14, an interlayer insulating film is preferably further formed. The interlayer insulating film mentioned above can be formed using a known material. For example, as the material for the interlayer insulating film, there may be mentioned an inorganic material, such as silicon oxide ($SiO_2$), silicon nitride (SiN or $Si_2N_4$) or tantalum oxide (TaO or $Ta_2O_5$), or an organic material, such as an acrylic resin or a resist material.

As a method for forming the interlayer insulating film, for example, there may be mentioned a dry process, such as a chemical vapor deposition (CVD) method or a vacuum deposition method, and a wet process such as a spin coating method. In addition, if needed, patterning may also be performed by a photolithographic method or the like.

When light emitted from the organic layer 14 is taken out of a second substrate (sealing substrate) 16 side facing the first substrate 11, a shading insulating film also having shading properties is preferably used as the interlayer insulating film. When the shading insulating film is used, the change in TFT characteristics caused by external light incident on the TFT formed on the first substrate 11 can be prevented.

In addition, as the interlayer insulating film, the insulating film and the shading insulating film, which are described above, may be used in combination.

As the shading interlayer insulating film described above, for example, there may be mentioned a material in which a pigment or a dye, such as phthalocyanine or quinacridone, is dispersed in a high molecular weight resin such as a polyimide; a color resist; a black matrix material; and an inorganic insulating material such as $Ni_xZn_yFe_2O_4$. However, this embodiment is not limited to those materials and formation methods.

When the active drive element (TFT) 18 is formed on the surface 11a of the first substrate 11, irregularities are formed in the surface, and by these irregularities, defects (damage to a pixel electrode, damage to an organic EL layer, breakage of a counter electrode, short circuit between a pixel electrode and a counter electrode, degradation in withstand voltage, and/or the like) may be generated in an organic layer to be formed on the irregularities. In order to prevent the defects generated by the irregularities as described above, a planarizing film may be further provided on the interlayer insulating film.

As the planarizing film described above, a known material may be used for the formation thereof, and for example, there may be mentioned an inorganic material, such as silicon oxide, silicon nitride, or tantalum oxide, or an organic material, such as a polyimide resin, an acrylic resin, or a resist material. As a method for forming the planarizing film, although a dry process, such as a CVD method or a vacuum deposition method, and a wet process, such as a spin coating method, may be mentioned, the present invention is not limited to those materials and formation methods. In addition, the planarizing film may have either a single layer structure or a multilayer structure.

The organic layer (organic EL layer) 14 is formed, for example, of the hole injection layer 21, the hole transport layer 22, the organic light emitting layer 23, the hole blocking layer 24, the electron transport layer 25, and the electron injection layer 26, which are provided between the first electrode 12 and the second electrode 13.

Figure 3:
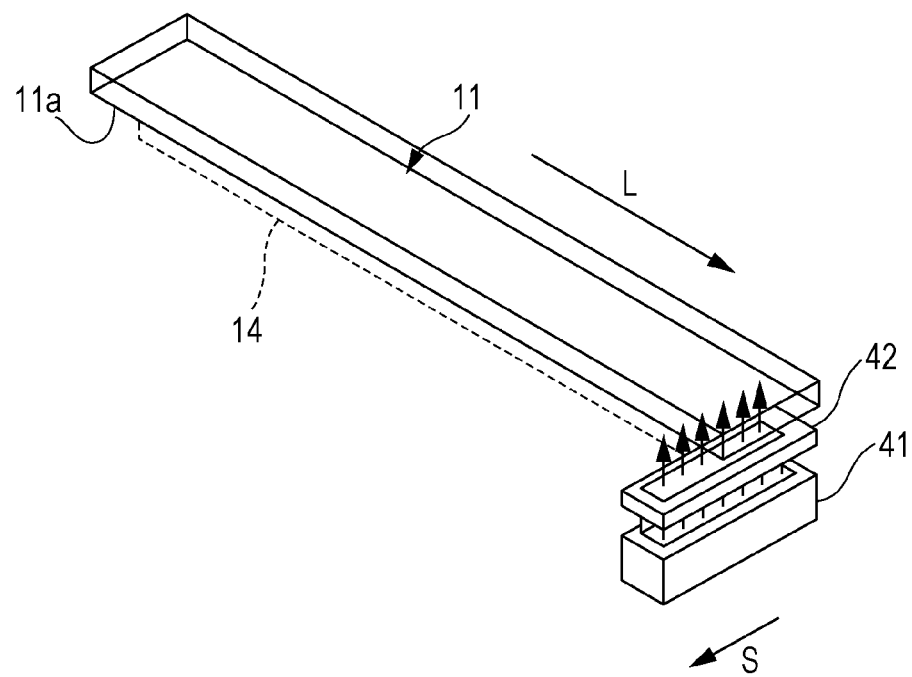
FIG. 3 is a view illustrating a method for manufacturing the organic EL display unit of the present invention.

The layers forming the organic layer 14 as described above each may be formed (film formation), for example, by deposition. In particular, for example, as shown in FIG. 3, a linear deposition head 41 arranged to extend along the short side direction S is used for the first substrate 11. In addition, while the first substrate 11 is conveyed along the long side direction L, a deposition material may be deposited onto this first substrate 11 from the linear deposition head 41 via a shadow mask 42 to form each layer forming the organic layer 14.

In a method in which color display is performed using a fluorescent substance layer (color conversion layer) as the optical conversion layer 15 which performs fluorescence conversion of light (excitation light) emitted from the organic layer 14, the organic layer 14 is formed to contain at least an organic light emitting layer 23 which emits blue light or ultraviolet light. In addition, in a method in which colorization is performed using a color filter as the optical conversion layer 15, the organic layer 14 is formed to contain an organic light emitting layer 23 which emits white light. The organic layer 14 as described above may have either a single layer structure of the organic light emitting layer 23 or a multilayer structure containing the organic light emitting layer 23 and the electron transport layer, and although the following structures are mentioned by way of example, this embodiment is not limited thereto.

(1) Organic light emitting layer
(2) Hole transport layer/organic light emitting layer
(3) Organic light emitting layer/electron transport layer
(4) Hole transport layer/organic light emitting layer/electron transport layer
(5) Hole injection layer/hole transport layer/organic light emitting layer/electron transport layer
(6) Hole injection layer/hole transport layer/organic light emitting layer/electron transport layer/electron injection layer
(7) Hole injection layer/hole transport layer/organic light emitting layer/hole blocking layer/electron transport layer
(8) Hole injection layer/hole transport layer/organic light emitting layer/hole blocking layer/electron transport layer/electron injection layer
(9) Hole injection layer/hole transport layer/electron blocking layer/organic light emitting layer/hole blocking layer/electron transport layer/electron injection layer Those organic light emitting layer, hole injection layer, hole transport layer, hole blocking layer, electron blocking layer, electron transport layer, and electron injection layer each may have either a single layer structure or a multilayer structure.

The organic light emitting layer 23 may be formed only from at least one of the organic light emitting materials shown below by way of example. In addition, the organic light emitting layer 23 may also be formed in combination of a light emitting guest material and a host material and may arbitrarily contain a hole transport material, an electron transport material, an additive (a donor, an acceptor, and/or the like), and the like. In addition, the organic light emitting layer 23 may have the structure in which the material shown below by way of example is dispersed in a high molecular weight material (binding resin) or an inorganic material. In consideration of the light emitting efficiency and life, the structure in which a light emitting guest material is dispersed in a host material is preferable.

As the organic light emitting material, a known light emitting material for organic El may be used. The organic light emitting material as described above is classified, for example, into a low molecular weight light emitting material and a high molecular weight light emitting material, and although concrete compounds thereof will be shown below by way of example, this embodiment is not limited thereto. In addition, the above light emitting material may also be a material to be classified, for example, into a fluorescent material and a phosphorescent material, and in consideration of reduction in power consumption, a phosphorescent material having a high light emitting efficiency is preferably used.

Hereinafter, although compounds will be described as concrete examples of the light emitting material forming the organic light emitting layer 23, this embodiment is not limited to those materials.

As the low molecular weight material, for example, there may be mentioned fluorescent organic materials including an aromatic dimethylidene compound such as 4,4'-bis(2,2'-diphenylvinyl)-biphenyl (DPVBi), an oxadiazole compound such as 5-methyl-2-[2-[4-(5-methyl-2-benzoxazolyl)phenyl]vinyl]benzooxazole, a triazole derivative such as 3-(4-biphenylyl)-4-phenyl-5-t-buthylphenyl-1,2,4-triazole (TAZ), a styryl benzene compound such as 1,4-bis(2-methylstyryl)benzene, a thiopyrazine dioxide derivative, a benzoquinone derivative, a naphthoquinone derivative, an anthraquinone derivative, a diphenoquinone derivative, and a fluorenone derivative; and fluorescent organometallic complexes, such as an azomethine zinc complex and an (8-hydroxyquinolinato)aluminum complex ($Alq_3$).

As the high molecular weight material, for example, there may be mentioned polyphenylenevinylene derivatives, such as poly(2-decyloxy-1,4-phenylene) (DO-PPP), poly[2,5-bis-[2-(N,N,N-triethylammonium)ethoxy]-1,4-phenyl-alt-1,4-phenylene]dibromide (PPP-NEt3+), poly[2-(2'-ethylhexyloxy)-5-methoxy-1,4-phenylenevinylene] (MEH-PPV), poly[5-methoxy-(2-propanoxysulfonide)-1,4-phenylenevinylene] (MPS-PPV), and poly[2,5-bis-(hexyloxy)-1,4-phenylene-(1-cyanovinylene)] (CN-PPV); and polyspiro derivatives such as poly(9,9-dioctylfluorene) (PDAF).

As the guest material arbitrarily contained in the organic light emitting layer, a known guest material for organic EL may be used. As the guest material described above, for example, there may be mentioned fluorescent light emitting materials, such as a styryl derivative, perylene, an iridium complex, a coumarin derivative, Lumogen F red, dicyanomethylene pyrane, phenoxazone, and a porphyrin derivative; and phosphorescent light emitting organometallic complexes, such as bis[(4,6-difluoro-phenyl)-pyridinato-N,C2'] picolinate iridium(III) (FIrpic), tris(2-phenylpyridyl)iridium (III) ($Ir(ppy)_3$), and tris(1-phenylisoquinoline)iridium(III) (Ir $(piq)_3$).

In addition, as the host material to be used when the guest material is used, a known host material for organic EL may be used. As the host material described above, for example, there may be mentioned the low molecular weight light emitting materials, the high molecular weight light emitting materials, both of which are described above, and carbazole derivatives, such as 4,4'-bis(carbazol)biphenyl and 9,9-di(4'-carbazolbenzyl) fluorene (CPF).

In order to efficiently perform injection of charges (holes, electrons) from the electrode and transport (injection) of charges into the light emitting layer, a charge injection transport layer is classified into a charge injection layer (the hole injection layer 21, the electron injection layer 26) and a charge transport layer (the hole transport layer 22, the electron transport layer 25). The charge injection transport layer as described above may be formed of a charge injection transport material shown below by way of example. The charge injection transport layer may arbitrarily contain at least one additive (donor, acceptor, and/or the like). The charge injection transport layer may be formed to have the structure in which the charge injection transport material shown below by way of example is dispersed in a high molecular weight material (binding resin) or an inorganic material.

As the charge injection transport material, a known charge injection transfer material for organic EL or for organic photoconductor may be used. The charge injection transport material as described above is classified into a hole injection transport material and an electron injection transport material, and although concrete compounds thereof will be shown below by way of example, this embodiment is not limited to those materials.

As the hole injection and the hole transport materials, for example, there may be mentioned oxides, such as vanadium oxide ($V_2O_5$) and molybdenum oxide ($MoO_2$); inorganic p-type semiconductor materials; low molecular weight materials including a porphyrin compound, an aromatic tertiary amine compound, such as N,N'-bis(3-methylphenyl)-N,N'-bis(phenyl)-benzidine (TPD) or N,N'-di(naphthalene-1-yl)-N,N'-diphenyl-benzidine (NPD), a hydrazone compound, a quinacridone compound, and a styryl amine compound; and high molecular weight materials, such as polyaniline (PAN™), polyaniline-camphorsulfonic acid (PANI-CSA), 3,4-polyethylene dioxythiophene/polystyrene sulfonate (PEDOT/PSS), a poly(triphenylamine) derivative (Poly-TPD), a polyvinyl carbazole (PVCz), a poly(p-phenylenevinylene) (PPV), and a poly(p-naphthalenevinylene) (PNV).

In addition, in order to more efficiently perform injection and transport of holes from the anode, as a material used of the hole injection layer 21, a material having an energy level of the highest occupied molecular orbital (HOMO) lower than that of a hole injection transport material used for the hole transport layer 22 is preferably used. As the hole transport layer 22, a material having a hole mobility higher than that of a hole injection transport material used for the hole injection layer 21 is preferably used.

In addition, in order to further improve the injection and transport properties of holes, the hole injection and the hole transport materials are each preferably doped with an acceptor. As the acceptor, a known acceptor for organic EL may be used. Although concrete compounds thereof will be shown below by way of example, this embodiment is not limited to those materials.

As the acceptor material, for example, there may be mentioned inorganic materials, such as Au, Pt, W, Ir, $POCl_3$, $AsF_6$, Cl, Br, I, vanadium oxide ($V_2O_5$), and molybdenum oxide ($MoO_2$); and organic materials including a compound having a cyano group, such as TCNQ (7,7,8,8-tetracyanoquinodimethane), $TCNQF_4$ (tetrafluorotetracyanoquinodimethane), TCNE (tetracyanoethylene), HCNB (hexacyanobutadiene), or DDQ (dicyclodicyanobenzoquinone), a compound having a nitro group, such as TNF (trinitrofluorenone) or DNF (dinitrofluorenone), fluoranil, chloranil, and bromanil.

Among those materials mentioned above, the compounds each having a cyano group, such as TCNQ, TCNQF$_4$, TCNE, HCNB, and DDQ, are more preferable since the carrier concentration can be more effectively increased.

As the electron injection and the electron transport materials, for example, there may be mentioned inorganic materials which are each an n-type semiconductor; low molecular weight materials, such as an oxadiazole derivative, a triazole derivative, a thiopyrazine dioxide derivative, a benzoquinone derivative, a naphthoquinone derivative, an anthraquinone derivative, a diphenoquinone derivative, a fluorenone derivative, and a benzodifuran derivative; and high molecular weight materials, such as a poly(oxadiazole) (Poly-OXZ) and a polystyrene derivative (PSS). In particular, as the electron injection material, fluorides, such as lithium fluoride (LiF) and barium fluoride (BaF$_2$), and oxides, such as lithium oxide (Li$_2$O), are specifically mentioned.

In addition, in order to more efficiently perform injection and transport of electrons from the cathode, as a material used for the electron injection layer 26, a material having an energy level of the lowest unoccupied molecular orbital (LUMO) higher than that of an electron injection transport material used for the electron transport layer 25 is preferably used. As a material used for the electron transport layer 25, a material having an electron mobility higher than that of an electron injection transport material used for the electron injection layer 26 is preferably used.

In addition, in order to further improve the injection and transport properties of electrons, the above-described electron injection and electron transport materials are each preferably doped with a donor. As the donor, a known donor for organic EL may be used. Although concrete compounds thereof will be shown below by way of example, this embodiment is not limited to those materials.

As the donor material, for example, there may be mentioned inorganic materials, such as an alkali metal, an alkaline earth metal, a rare earth element, Al, Ag, Cu, and In; and organic materials including an aniline, a phenylenediamine, a compound having an aromatic tertiary amine, such as a benzidine (N,N,N',N'-tetraphenyl-benzidine, N,N'-bis-(3-methylphenyl)-N,N'-bis-(phenyl)-benzidine, N,N'-di(naphthalene-1-yl)-N,N'-diphenyl-benzidine, or the like), a triphenylamine (triphenylamine, 4,4'4"-tris(N,N-diphenyl-amino)-triphenylamine), 4 4'4"-tris(N-3-methylphenyl-N-phenyl-amino)-triphenylamine, 4,4',4"-tris(N-(1-naphthyl)-N-phenyl-amino)-triphenylamine, or the like), or a triphenyldiamine (N,N'-di(4-methyl-phenyl)-N,N'-diphenyl-1,4-phenylenediamine), a condensed polycyclic compound (however, which may have a substituent group), such as phenanthrene, pyrene, perylene, anthracene, tetracene, or pentacene, a TTF (tetrathiafulvalene), dibenzofuran, phenothiazine, and carbazole. Among those mentioned above, the compound having an aromatic tertiary amine structure, the condensed polycyclic compound, and the alkali metal are more preferable since the carrier concentration can be more effectively increased.

The organic layer 14, such as the organic light emitting layer 23, the hole transport layer 22, the electron transport layer 25, the hole injection layer 21, and the electron injection layer 26, may be formed, for example, by a known wet process including a coating method, such as a spin coating method, a dipping method, a doctor blade method, an ejection coating method, or a spray coating method, or a printing method, such as an ink jet method, a relief printing method, an intaglio printing method, a screen printing method, or a micro gravure coating method, the methods mentioned above each using coating liquid for forming an organic layer which contains the above material dissolved and dispersed in a solvent; a known dry process, such as a resistance heating deposition method, an electron beam (EB) deposition method, a molecular beam epitaxy (MBE) method, a sputtering method, or an organic vapor phase deposition (OVPD) method, those methods each using the material mentioned above; or a laser transfer method. In addition, when the organic EL layer is formed by a wet process, coating liquid for forming an organic EL-layer may also contain at least one additive, such as a leveling agent and/or a viscosity controller, for controlling the properties of the coating liquid.

Although being approximately 1 to 1,000 nm in general, the film thickness of the organic layer 14 is preferably 10 to 200 nm. When the film thickness is less than 10 nm, essentially required properties (a charge injection property, a charge transport property, and a charge trapping property) may not be obtained. In addition, a pixel defect may occur in some cases due to a foreign material such as dirt. In addition, when the film thickness is more than 200 nm, a drive voltage is increased by a resistance component of the organic layer 14, and as a result, the power consumption is increased.

The first electrode 12 and the second electrode 13 function as a pair of electrodes, an anode and a cathode, for the organic layer 14. That is, when the first electrode 12 functions as an anode, the second electrode 13 functions as a cathode, and when the first electrode 12 functions as a cathode, the second electrode 13 functions as an anode. Hereinafter, although concrete compounds and formation methods will be shown below by way of example, this embodiment is not limited to those materials and formation methods.

As electrode materials forming the first electrode 12 and the second electrode 13, known electrode materials may be used. In the case of the anode, in order to perform more efficient injection of holes into the organic layer 14, there may be mentioned a metal, such as gold (Au), platinum (Pt), or nickel (Ni), each having a work function of 4.5 eV or more, and a transparent electrode material, such as an oxide (ITO) formed of indium (In) and tin (Sn), an oxide (SnO$_2$) of tin (Sn), or an oxide (IZO) formed of indium (In) and zinc (Zn).

In addition, as the electrode material forming the cathode, in order to perform more efficient injection of electrons into the organic layer 14, there may be mentioned a metal, such as lithium (Li), calcium (Ca), cerium (Ce), barium (Ba), or aluminum (Al), each having a work function of 4.5 eV or less, or an alloy, such as a material which contains the metal mentioned above in Mg:Ag alloy or a Li:Al alloy.

Although the first electrode 12 and the second electrode 13 can be formed using the above materials by a known method, such as an EB deposition method, a sputtering method, an ion plating method, or a resistance heating deposition method, this embodiment is not limited to those formation methods. In addition, if needed, the electrode thus formed may be patterned by a photolithographic method or a laser ablation method, and a patterned electrode may also be directly formed in combination with a shadow mask. The film thickness is preferably 50 nm or more. When the film thickness is less than 50 nm, since the wiring resistance thereof is increased, the drive voltage may be increased in some cases.

When light emitted from the organic layer 14 is taken out of a first electrode side (second electrode), a transparent electrode is preferably used as the first electrode (second electrode). As a transparent electrode material to be used in this case, ITO or IZO is particularly preferable. The film thickness of the transparent electrode is preferably 50 to 500 nm and more preferably 100 to 300 nm. When the film thickness is less than 50 nm, since the wiring resistance thereof is increased, the drive voltage may be increased in some cases.

In addition, when the film thickness is more than 500 nm, since the light transmittance is decreased, the luminance may be decreased in some cases. In addition, in the case in which a microcavity (interference) effect is used in order to improve color purity, light emission efficiency, and the like, when light emitted from the organic EL layer is taken out of the first electrode side (second electrode), a semi-transparent electrode is preferably used as the first electrode (second electrode).

As a material to be used in this case, although a semi-transparent metal electrode itself or a combination between a semi-transparent metal electrode and a transparent electrode material may be used, as the semi-transparent electrode material, silver is preferable in terms of reflectance and transmittance. The film thickness of the semi-transparent electrode is preferably 5 to 30 nm. When the film thickness is less than 5 nm, reflection of light cannot be sufficiently performed, and as a result, the interference effect cannot be sufficiently obtained. In addition, when the film thickness is more than 30 nm, since the light transmittance is rapidly decreased, the luminance and the efficiency may be decreased in some cases.

In addition, when light emitted from the organic layer 14 is taken out of the first electrode (second electrode), an electrode through which light is not allowed to pass is preferably used as the second electrode (first electrode). As an electrode material to be used in this case, for example, there may be mentioned a black electrode of tantalum, carbon, or the like; a reflective metal electrode of aluminum, silver, gold, an aluminum-lithium alloy, an aluminum-neodymium alloy, an aluminum-silicon alloy, or the like; and an electrode formed in combination of a transparent electrode and the above reflective metal electrode (reflective electrode).

In the organic EL display unit and the organic EL display device in which organic EL display units, each of which is the organic EL display unit described above, are arranged, an edge cover may be formed between the first electrode 12 and the second electrode 13. Since the edge cover is provided, a leak between the first electrode 12 and the second electrode 13 is prevented at an edge portion of the first electrode 12. In this case, the edge cover may be formed using an insulating material by a known method, such as an EB deposition method, a sputtering method, an ion plating method, or a resistance heating deposition method, and by a known dry or wet photolithographic method, patterning can be performed; however, this embodiment is not limited to those formation methods.

In addition, known materials may be used as a material forming an insulating layer, and the material is not particularly limited in this embodiment. The material forming an insulating layer is required to allow light to pass therethrough, and for example, SiO, SiON, SiN, SiOC, SiC, HfSiON, ZrO, HfO, and LaO may be mentioned. In addition, as the film thickness, 100 to 2,000 nm is preferable. When the film thickness is less than 100 nm, since the insulating property is not sufficient, a leak occurs between the first electrode 12 and the second electrode 13, and as a result, an increase in power consumption and no light emission may occur. In addition, when the film thickness is more than 2,000 nm, since a time used for a film formation process is increased, the productivity is degraded, and the second electrode 13 may be disconnected thereby at the edge cover.

The second substrate (sealing substrate) 16 can be formed by a known sealing method using a known sealing material. In particular, a method in which an inert gas, such as a nitrogen gas or an argon gas, is sealed by a glass, a metal, or the like may be mentioned. Furthermore, a method in which for example, a moisture absorber, such as barium oxide, is mixed in a sealed inert gas is more preferable since the degradation of the organic layer 14 caused by moisture can be more preferably suppressed.

In addition, when a resin is applied or adhered on the second electrode 13 using a spin coating method, ODF, or a lamination method, the second substrate (sealing substrate) 16 may also be formed as a sealing film. Furthermore, after an inorganic film of SiO, SiON, SiN, or the like is formed on the second electrode 13 by a plasma CVD method, an ion plating method, an ion beam method, a sputtering method, or the like, when a resin is further applied or adhered using a spin coating method, ODF, or a lamination method, the sealing film may also be formed. By this sealing film, oxygen and moisture in the outside air are prevented from entering an element, and the life of the organic layer 14 is increased. In addition, this embodiment is not limited to those members and formation methods. In addition, in the structure in which light is taken out of the second substrate (sealing substrate) 16, an optical transparent material must be used for both the sealing film and the sealing substrate.

The optical conversion layer 15 is formed, for example, of a blue color conversion layer, a red color conversion layer, or a green color conversion layer, each of which absorbs ultraviolet or blue excitation light from the organic layer 14 and emits blue, green, or red light. In addition, if needed, the color conversion layer may be a color conversion layer which emits cyan or yellow light.

In addition, when light emitting elements corresponding to the respective colors are provided as pixels in a display device, the color impurity of each pixel which emits cyan or yellow light is preferably located outside of a triangle formed in the chromaticity diagram by connecting color impurities of pixels each emitting red, green, or blue light. According to the display device as described above, compared to a display device using pixels each emitting one of three primary colors, red, green, or blue light, the color reproduction range can be further increased.

The optical conversion layer 15 may be formed only from at least one of the fluorescent materials shown below by way of example. The optical conversion layer 15 may also be formed from at least one of the following fluorescent materials shown below by way of example and an additive or the like, each of which is arbitrarily contained. The optical conversion layer 15 may have the structure in which the material shown below by way of example is dispersed in a high molecular weight material (binding resin) or an inorganic material.

As the optical conversion material described above, a known fluorescent conversion material may be used. The fluorescent conversion material as described above may be classified into an organic fluorescent material and an inorganic fluorescent material. Although concrete compounds of the organic fluorescent material and the inorganic fluorescent material will be shown below by way of example, this embodiment is not limited to those materials.

In the organic fluorescent material, as a fluorescent dye which converts ultraviolet excitation light into blue light, for example, there may be mentioned styrylbenzene dyes, such as 1,4-bis(2-methylstyryl)benzene and trans-4,4'-diphenyl stilbenzene; and coumarin dyes such as 7-hydroxy-4-methylcoumarin.

As a fluorescent dye which converts ultraviolet or blue excitation light into green light, for example, there may be mentioned coumarin dyes, such as 2,3,5,6-1H,4H-tetrahydro-8-triphlomethylquinolizine(9,9a,1-gh)coumarin (coumarin 153), 3-(2'-benzothiazolyl)-7-diethylaminocoumarin (coumarin 6), and 3-(2'-benzoimidazolyl)-7-N,N-diethylaminocoumarin (coumarin 7); and naphthalimide dyes, such as Basic Yellow 51, Solvent Yellow 11, and Solvent Yellow 116.

As a fluorescent dye which converts ultraviolet or blue excitation light into red light, for example, there may be mentioned cyanine dyes, such as 4-dicyanomethylene-2-methyl-6-(p-dimethylaminostyryl)-4H-pyran; pyridine dyes, such as 1-ethyl-2-[4-(p-dimethylaminophenyl)-1,3-butadienyl]-pyridinium-perchlorate; and rhodamine dyes, such as Rhodamine B, Rhodamine 6G, Rhodamine 3B, Rhodamine 101, Rhodamine 110, Basic Violet 11, and Sulforhodamine 101.

In the inorganic fluorescent material, as a fluorescent material which converts ultraviolet excitation light into blue light, for example, there may be mentioned $Sr_2P_2O_7:Sn^{4+}$, $Sr_4Al_{14}O_{25}:Eu^{2+}$, $BaMgAl_{10}O_{17}:Eu^{2+}$, $SrGa_2S_4:Ce^{3+}$, $CaGa_2S_4:Ce^{3+}$, $(Ba, Sr) (Mg, Mn) Al_{10}O_{17}:Eu^{2+}$, $(Sr, Ca, Ba_2, Mg)_{10}(PO_4)_6Cl_2:Eu^{2+}$, $BaAl_2SiO_8:Eu^{2+}$, $Sr_2P_2O_7:Eu^{2+}$, $Sr_5(PO_4)_3Cl:Eu^{2+}$, $(Sr, Ca, Ba)_5(PO_4)_3Cl:Eu^{2+}$, $BaMg_2Al_{16}O_{27}:Eu^{2+}$, $(Ba, Ca)_5(PO_4)_3Cl:Eu^{2+}$, $Ba_3MgSi_2O_8:Eu^{2+}$, and $Sr_3MgSi_2O_8:Eu^{2+}$.

As a fluorescent material which converts ultraviolet or blue excitation light into green light, for example, there may be mentioned $(BaMg) Al_{16}O_{27}:Eu^{2+}, Mn^{2+}$, $Sr_4Al_{14}O_{25}:Eu^{2+}$, $(SrBa) Al_{12}Si_2O_8:Eu^{2+}$, $(BaMg)_2SiO_4:Eu^{2+}$, $Y_2SiO_5:Ce^{3+}, Tb^{3+}$, $Sr_2P_2O_7\_Sr_2B_2O_5:Eu^{2+}$, $(BaCaMg)_5(PO_4)_3Cl:Eu^{2+}$, $Sr_2Si_3O_8\_2SrCl_2:Eu^{2+}$, $Zr_2SiO_4$, $MgAl_{11}O_{19}:Ce^{3+}, Tb^{3+}$, $Ba_2SiO_4:Eu^{2+}$, $Sr_2SiO_4:Eu^{2+}$, and $(BaSr) SiO_4:Eu^{2+}$.

As a fluorescent material which converts ultraviolet or blue excitation light into red light, for example, there may be mentioned $Y_2O_2S:Eu^{3+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P, V) O_4:Eu^{3+}$, $Mg_4GeO_{5.5}F:Mn^{4+}$, $Mg_4GeO_6:Mn^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, and $Na_5Eu_{2.5}(MoO_4)_{6.25}$.

In addition, the above inorganic fluorescent material may be processed by a surface modification treatment, if needed. As a method of the surface modification treatment, for example, there may be mentioned a chemical treatment using a silane coupling agent or the like, a physical treatment by addition of submicron-order particles or the like, and a treatment performed in combination of the above two treatments.

In addition, when the issues with regard to stability, such as degradation by excitation light and/or degradation by light emission, are taken into consideration, the inorganic fluorescent material is preferably used as compared to the organic fluorescent material.

A formation method of the optical conversion layer 15 as described above is not particularly limited, and various methods may be used.

For example, after an organic fluorescent material is dispersed in a polymer binder, when film formation is performed, a color conversion layer can be obtained. As the film formation method, for example, there may be used a wet process including a casting method, a spin coating method, a printing method, such as a relief printing method, an intaglio printing method, a screen printing method, or a micro gravure coating method, a bar coating method, an extrusion molding method, a roll molding method, a press method, a spray method, or a roll coating method; a known dry process, such as a resistance heating deposition method, an electron beam (EB) deposition method, a molecular beam epitaxy (MBE) method, a sputtering method, or an organic vapor phase deposition (OVPD) method; or a laser transfer method.

In addition, when an organic solvent is used in those film formation methods, for example, as the organic solvent, there may be used dichloromethane, 1,2-dichloroethane, chloroform, acetone, cyclohexanone, toluene, benzene, xylene, N,N-dimethylformamide, dimethyl sulfoxide, 1,2-dimethoxyethane, or diethylene glycol dimethyl ether. Those solvents may be used alone, or at least two thereof may be used in combination.

In addition, when the optical conversion layer 15 is formed, if a photosensitive resin is used as the high molecular weight material described above, patterning can be performed by a photolithographic method. In this case, as the above photosensitive resin, for example, there may be used one photosensitive resin (photocurable resist material), such as an acrylic resin, a methacrylic resin, a poly(vinyl cinnamate) resin, or a vulcanizable rubber resin, having a reactive vinyl group or a mixture containing at least two of the resins mentioned above.

In addition, as for the patterning of the optical conversion layer 15, patterning of the fluorescent material can be directly performed by a wet process, such as an ink jet method, a relief printing method, an intaglio printing method, or a screen printing method; a known dry process, such as a resistance heating deposition method, an electron beam (EB) deposition method, a molecular beam epitaxy (MBE) method, a sputtering method, or an organic vapor phase deposition (OVPD) method, each of which uses a shadow mask; or a laser transfer method.

When the color filter is used as the optical conversion layer 15, a known material may also be used for the formation thereof. When a photosensitive resin is used, the color filter itself may be exposed and developed for pattern formation. In addition, when a fine pattern is formed, the pattern is preferably formed by dry etching.

The organic EL display device of this embodiment in which a plurality of organic EL display units, each of which has been described above in detail, are arranged will be described.

Figure 4:
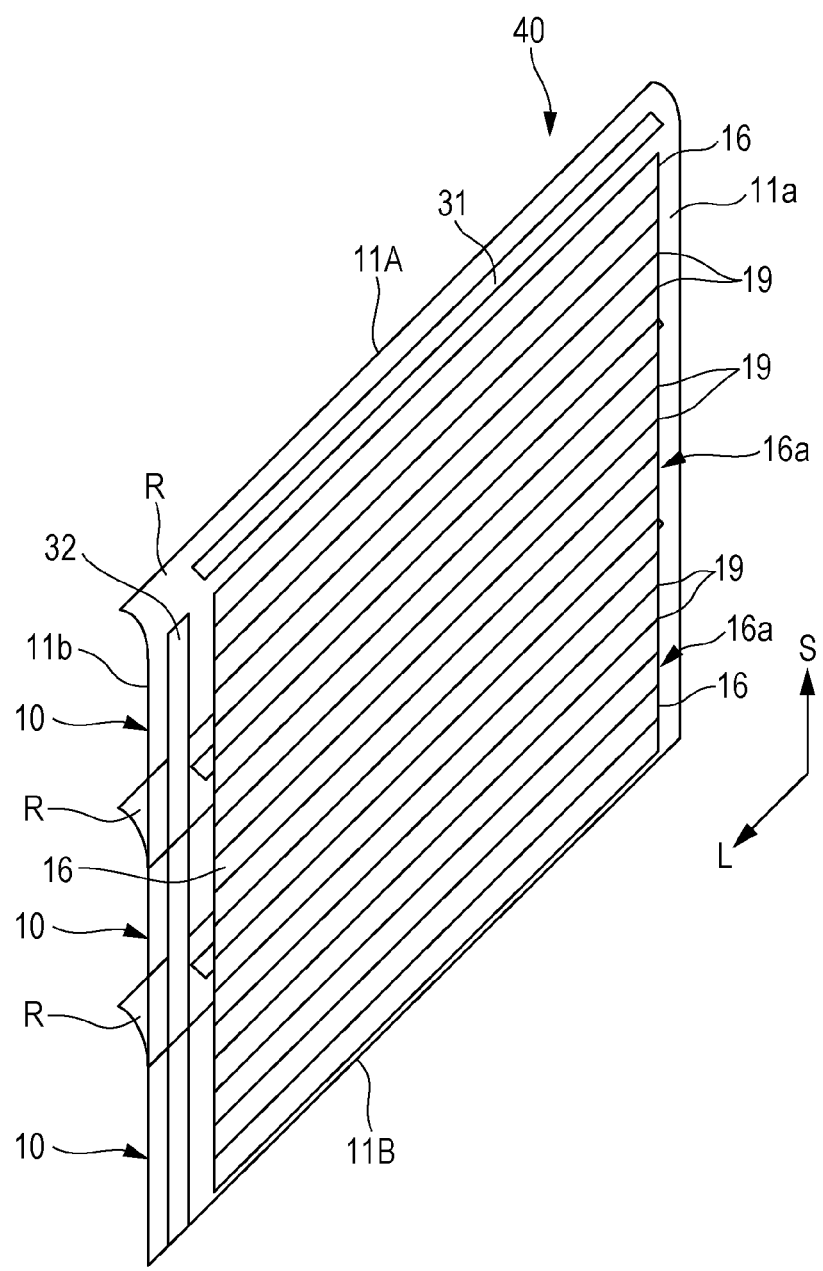
FIG. 4 is an external perspective view showing an organic EL display device of the present invention.

FIG. 4 is an external perspective view showing one embodiment of the organic EL display device of the present invention.

An organic EL display device 40 is formed of a plurality of organic EL display units 10 each shown in FIGS. 1 and 2 arranged along the short side direction S, and in this embodiment, three organic EL display units 10 are used.

In more particular, an organic EL display unit 10 placed at the center is arranged so that the end portion 11A having the curved surface R is in contact with another end portion 11B of an adjacent organic EL display unit 10. In addition, at the end portion 11A at which the organic EL display units 10 are in contact with each other, the curved surface R is formed to be curved in a direction apart from the rear surface 11b of the adjacent organic EL display unit 10. Hence, the adjacent display surfaces 16a can be arranged in contact with each other without forming a large gap therebetween.

In addition, since the first connection terminal portion 31 is formed on the curved surface R, even if the display surfaces 16a are in close contact with each other, a structure for inputting an image signal can be easily realized. Even when many (for example, at least five) display surfaces 16a of the organic EL display units 10 are in close contact with each other, an image signal can be easily input.

In addition, in this embodiment, the second substrate (sealing substrate) 16 of each organic EL display unit 10 is divided into a plurality of sections along the long side direction L by the narrow groove portions 19. Accordingly, a thin line (groove) formed at a portion at which the adjacent display surfaces 16a are in contact with each other becomes inconspicuous in appearance by the presence of the groove portions 19 of the second substrate 16. Hence, when a plurality of the display surfaces 16a is viewed as one large screen of an organic EL display device 40 in which a plurality of the organic EL display units 10 are arranged, seams formed between the display surfaces 16a can be suppressed from being recognized, and a high-quality large screen display device can be realized.

Figure 5:
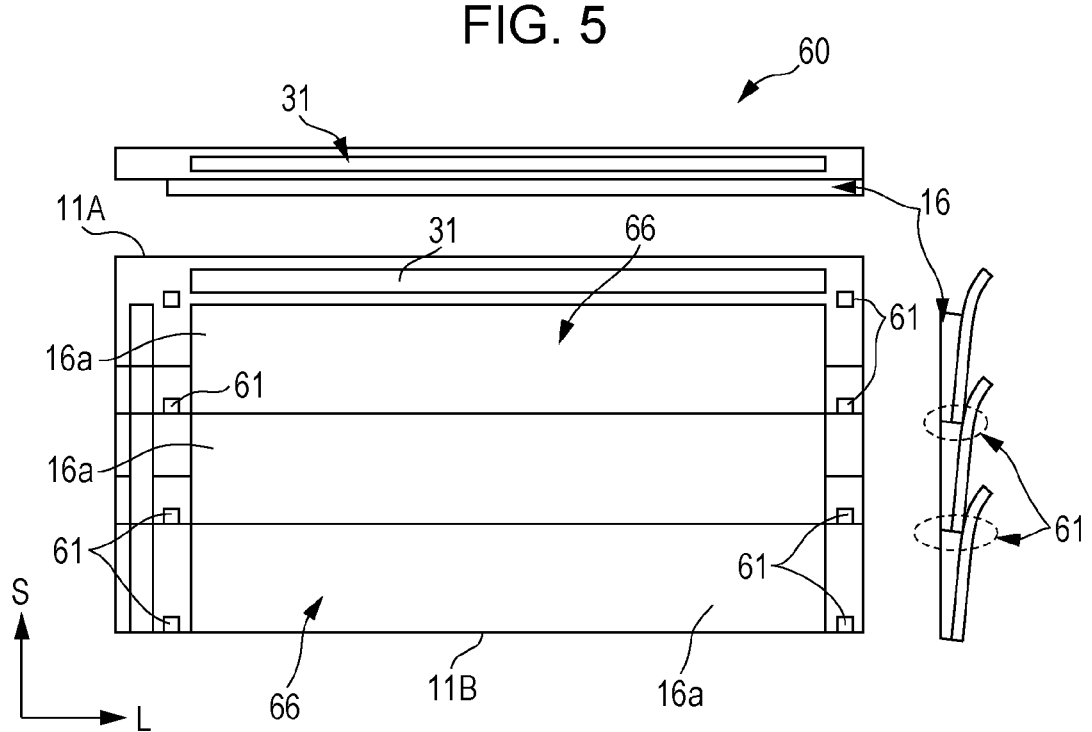
FIG. 5 is an external perspective view showing another embodiment of the organic EL display device of the present invention.

FIG. 5 is a plan view showing another embodiment of the organic EL display device of the present invention.

In an organic EL display device 60 of this embodiment, one end portion 11B along a long side direction L is in contact with a display surface 16a side of an adjacent organic EL display unit 66, and the other end portion 11A is arranged so as to be in contact with a rear surface 11B side of another adjacent organic EL display unit 66.

In addition, on each organic EL display unit 66, alignment markers 61 are formed. This alignment marker 61 may be formed on a part of the first substrate 11 located outside the display surface 16a. In addition, when the organic EL display units 66 are arranged to each other, if the arrangement is performed based on those alignment markers 61, the display surfaces 16a are placed in close contact with each other to reduce the gaps formed therebetween, so that the seams on the screen can be made to be inconspicuous.

Figure 6:
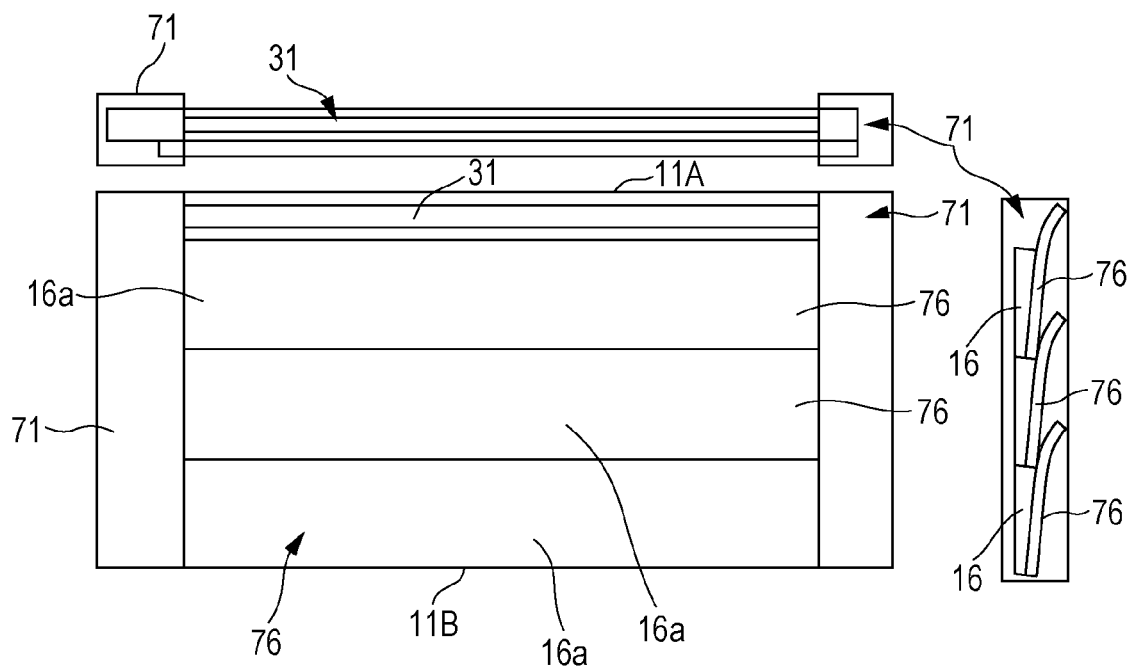
FIG. 6 is an external perspective view showing another embodiment of the organic EL display device of the present invention.

FIG. 6 is a plan view showing another embodiment of the organic EL display device of this embodiment.

In an organic EL display device 70 of this embodiment, one end portion 11A along a long side direction L is in contact with a display surface 16a side of an adjacent organic EL display unit 76, and the other end portion 11B is arranged so as to be in contact with a rear surface 11b side of another adjacent organic EL display unit 76.

In addition, each organic EL display unit 76 is supported at a predetermined position by support frames 71 arranged along a short side direction S. By those support frames 71, the display surfaces 16a of the adjacent organic EL display units 76 are placed in close contact with each other to reduce the gaps formed therebetween, so that the seams on the screen can be made to be inconspicuous.

EXAMPLES

Hereinafter, although more concrete examples of the organic EL display device according to one aspect of the present invention will be described by way of example, the aspect of the present invention is not limited to those examples.

Example 1

By using a plastic substrate having a rectangular shape of 500 mm×220 mm and coated with a 200 nm-thick silicon oxide, a transparent electrode (anode) was formed as a first electrode from indium-tin oxide (ITO) by a sputtering method. The transparent electrode (anode) was formed to have a sheet resistance of 10Ω/□ and a film thickness of 200 nm.

Next, only in an area of 492 mm×220 mm of the above rectangular shape, the ITO was patterned to have a stripe shape with a width of 1 mm in a direction along a width of 250 mm by a related photolithographic method. In this case, the shape of each ITO was 250 mm×1 mm.

Next, a $SiO_2$ having a thickness of 200 nm was laminated on the first electrode by a sputtering method and was then patterned by a related photolithographic method so as to cover an edge portion of the first electrode. In this case, the structure was formed in which an area from each of the four sides of the first electrode to a position 10 μm inside thereof was covered with $SiO_2$. After deionized (DI) water rinse, the DI water ultrasonic cleaning for 10 minutes, acetone ultrasonic cleaning for 10 minutes, and isopropyl alcohol vapor treatment for 5 minutes were carried out, and drying was then performed at 100° C. for 1 hour. In addition, a display portion formed on the substrate having a rectangular shape of 500 mm×220 mm had a size of 492 mm×200 mm, and a 2-mm terminal leading portion was provided at each short side outside a sealing area. At a long side at which bending was performed, a 2-mm terminal leading portion was provided.

Next, this substrate was fixed to a substrate holder in an in-line resistance heating deposition apparatus, and the pressure was reduced to $1 \times 10^{-4}$ Pa or less. Subsequently, in a desired region, a hole injection layer having a film thickness of 100 nm was formed by a resistance heating deposition method with a shadow mask using 1,1-bis-di-4-tolylaminophenyl-cyclohexane (TAPC) as a hole injection material.

Next, a hole transport layer having a film thickness of 40 nm was formed by a resistance heating deposition method using N,N'-di-1-naphthyl-N,N'-diphenyl-1,1'-biphenyl-1,1'-biphenyl-4,4'-diamine (NPD) as a hole transport material.

Next, a blue organic light emitting layer (thickness: 30 nm) was formed in a desired region on the hole transport layer using a shadow mask. This blue organic light emitting layer was formed by co-deposition of 1,4-bis-triphenylsilyl-benzene (UGH-2) (host material) and bis[(4,6-difluorophenyl)-pyridinato-N,C2']picolinate iridium(III) (FIrpic) (blue phosphorescent guest material) at deposition rates of 1.5 and 0.2 Å/sec, respectively.

Next, a hole blocking layer (thickness: 10 nm) was formed on the light emitting layer using 2,9-dimethyl-4,7-diphenyl-1,10-phenanthroline (BCP).

Subsequently, an electron transport layer (thickness: 30 nm) was formed on the hole blocking layer using tris(8-hydroxyquinoline)aluminum ($Alq_3$).

Next, an electron injection layer (thickness: 1 nm) was formed on the electron transport layer using lithium fluoride (LiF).

Subsequently, a second electrode was formed. First, the substrate described above was fixed to a metal deposition chamber.

Next, a shadow mask used for second electrode formation (mask having openings to form a second electrode in a stripe shape with a width of 1 mm so as to face the stripe of the firs electrode) and the substrate described above were aligned, and a desired pattern of aluminum (thickness: 200 nm) was then formed on the surface of the electron injection layer by a vacuum deposition method. As a result, the second electrode was formed.

By a sputtering method, an inorganic protective layer of a $SiO_2$ having a thickness of 1 μm was formed from the ends of the display portion to positions 2 mm inside the sealing area in an upper, a lower, a left, and a right direction by patterning using a shadow mask. On this protective layer, a parylene film having a thickness of 2 μm was formed by a deposition polymerization method. The formation of $SiO_2$ and that of parylene were repeatedly performed five times to form a laminate film having five layers as a sealing film.

Next, on a polyimide film having a size of 496 mm×3 mm, a blue conversion layer, a green conversion layer, and a red conversion layer, which had a film thickness of 5 μm and a plurality of stripes with a width of 0.1 mm and a pitch of 0.125 mm, were formed by a common method. Subsequently, 64 polyimide films, each of which was described above, were arranged in parallel on a rear surface of an organic EL display unit and were then adhered thereto with an adhesive thermosetting resin by heating at 80° C. for 1 hour using a hot plate.

Next, three organic EL display units each formed as described above were aligned using alignment markers formed at the short sides outside the display portion and were adhered to each other at a long side. In addition, a terminal portion provided at the long side was bent in advance.

Finally, a power source outside the EL display unit was connected to terminals formed at the short sides and terminals formed at the long sides, so that an organic EL display device having a display portion of 492 mm×600 mm was completed.

In addition, when a desired current was applied to the desired stripe-shaped electrodes by the outside power source, a desired excellent image could be obtained.

Example 2

By using a plastic substrate having a rectangular shape of 500 mm×220 mm and coated with a 200 nm-thick silicon oxide, a transparent electrode (anode) was formed as a first electrode from indium-tin oxide (ITO) by a sputtering method. The transparent electrode (anode) was formed to have a sheet resistance of 10Ω/□ and a film thickness of 200 nm.

Next, only in an area of 492 mm×220 mm of the above rectangular shape, the ITO was patterned to have a stripe shape with a width of 1 mm in a direction along a width of 250 mm by a related photolithographic method. In this case, the shape of each ITO was 250 mm×1 mm.

Next, a $SiO_2$ having a thickness of 200 nm was laminated on the first electrode by a sputtering method and was then patterned by a related photolithographic method so as to cover an edge portion of the first electrode. In this case, the structure was formed in which an area from each of the four sides of the first electrode to a position 10 μm inside thereof was covered with $SiO_2$. After water washing was performed, pure water ultrasonic washing for 10 minutes, acetone ultrasonic washing for 10 minutes, and isopropyl alcohol vapor washing for 5 minutes were carried out, and drying was then performed at 100° C. for 1 hour. In addition, a display portion formed on the substrate having a rectangular shape of 500 mm×220 mm had a size of 492 mm×200 mm. At each short side outside a sealing area, a 2-mm terminal leading portion was provided. At a long side at which bending was performed, a 2-mm terminal leading portion was provided.

Next, this substrate was fixed to a substrate holder in an in-line resistance heating deposition apparatus, and the pressure was reduced to $1 \times 10^{-4}$ Pa or less.

Subsequently, in a desired region, a hole injection layer having a film thickness of 100 nm was formed by a resistance heating deposition method using 1,1-bis-di-4-tolylamino-phenyl-cyclohexane (TAPC) as a hole injection material.

Next, a hole transport layer having a film thickness of 40 nm was formed by a resistance heating deposition method using N,N'-di-1-naphthyl-N,N'-diphenyl-1,1'-biphenyl-1,1'-biphenyl-4,4'-diamine (NPD) as a hole transport material.

Next, a red organic light emitting layer (thickness: 20 nm) was formed on the hole transport layer. This red light emitting layer was formed by co-deposition of 3-phenyl-4(1'-naphthyl)-5-phenyl-1,2,4-triazole (TAZ) (host material) and bis (2-(2'-benzo[4,5-α]thienyl)pyridinato-N, C3')iridium(acetylacetonate) ($btp_2Ir(acac)$) (red phosphorescent guest material) at deposition rates of 1.4 and 0.15 Å/sec, respectively.

Next, a green organic light emitting layer (thickness: 20 nm) was formed on the red light emitting layer. This green light emitting layer was formed by co-deposition of TAZ (host material) and tris(2-phenylpyridine)iridium(III) (Ir (ppy)$_2$) (green phosphorescent guest material) at deposition rates of 1.5 and 0.2 Å/sec, respectively.

Next, a blue organic light emitting layer (thickness: 20 nm) was formed on the green light emitting layer. This blue light emitting layer was formed by co-deposition of 1,4-bis-triphenylsilyl-benzene (UGH-2) (host material) and bis[(4,6-difluorophenyl)-pyridinato-N,C2']picolinateiridium(III) (Fl-rpic) (blue phosphorescent guest material) at deposition rates of 1.5 and 0.2 Å/sec, respectively.

Next, a hole blocking layer (thickness: 10 nm) was formed on the light emitting layer using 2,9-dimethyl-4,7-diphenyl-1,10-phenanthroline (BCP).

Subsequently, an electron transport layer (thickness: 30 nm) was formed on the hole blocking layer using tris(8-hydroxyquinoline)aluminum ($Alq_3$).

Next, an electron injection layer (thickness: 1 nm) was formed on the electron transport layer using a lithium fluoride (LiF).

Subsequently, a second electrode was formed. First, the substrate described above was fixed to a metal deposition chamber.

Next, a shadow mask used for second electrode formation (mask having an opening to form a second electrode so as to cover the whole first electrode with an area larger than that thereof by 2 mm at each side) and the substrate described above were aligned, and a desired pattern of aluminum (thickness: 200 nm) was then formed on the surface of the electron injection layer by a vacuum deposition method. As a result, the second electrode was formed.

By a sputtering method, an inorganic protective layer of a $SiO_2$ having a thickness of 1 μm was formed from the ends of the display portion to positions 2 mm inside the sealing area in an upper, a lower, a left, and a right direction by patterning using a shadow mask. On this protective layer, a parylene film having a thickness of 2 μm was formed by a deposition polymerization method. The formation of $SiO_2$ and that of parylene were repeatedly performed five times to form a laminate film having five layers as a sealing film. As a result, a rectangular organic EL of this example was formed.

Next, on a polyimide film having a size of 496 mm×3 mm, a blue color filter layer, a green color filter layer, and a red color filter layer, which had a film thickness of 5 μm and a plurality of stripes with a width of 0.1 mm and a pitch of 0.125 mm, were formed by a common method. Subsequently, 64 polyimide films, each of which was described above, were arranged in parallel on a rear surface of the rectangular organic EL and were then adhered thereto with an adhesive thermosetting resin by heating at 80° C. for 1 hour using a hot plate.

Next, three organic EL display units each formed as described above were aligned using alignment markers formed at the short sides outside the display portion and were adhered to each other in a long side direction. In addition, a terminal portion provided at the long side was bent in advance.

Finally, terminals formed at the short sides and terminals formed at the long sides were connected to an outside power source, so that an organic EL display device having a display portion of 492 mm×600 mm was completed.

In addition, when a desired current was applied to the desired stripe-shaped electrodes by the outside power source, a desired excellent image could be obtained.

Example 3

By using an invar substrate having a rectangular shape of 750 mm×220 mm and coated with a 10 μm-thick silicon oxide, an amorphous silicon semiconductor film was formed on a glass substrate by a PECVD method. Subsequently, by a crystallization treatment, a polycrystalline silicon semiconductor film was formed. Next, by a photolithographic method, the polycrystalline silicon semiconductor film was patterned into a plurality of islands. Subsequently, on a patterned polycrystalline silicon semiconductor layer, a gate insulating film and a gate electrode layer were formed in this order, and patterning was then performed by a photolithographic method.

Subsequently, the patterned polycrystalline silicon semiconductor film was doped with an impurity element, such as phosphorous, to a form a source and a drain region, thereby forming a TFT element. Next, a planarizing film was formed. The planarizing film was formed by deposition of a silicon nitride film by a PECVD method and spin-coating of an acrylic resin in this order. First, after the silicon nitride film was formed, the silicon nitride film and the gate insulating film were collectively etched so that a contact hole which reaches the source and the drain region was formed, and the wires that connect individual TFTs were then formed. Subsequently, the acrylic resin layer was formed, and a contact hole was formed therein so as to reach the drain region at the same position as that at which the contact hole was formed in the gate insulating film and the silicon nitride film in the drain region. Accordingly, an active matrix substrate was completed, for example, by the steps described above.

Planarization was realized by the acrylic resin layer. In addition, a capacitor maintaining the gate of the TFT at a constant voltage was formed by providing a gate insulating film as a dielectric layer between a drain of a switching TFT and a source of a drive TFT. On the active matrix substrate, a contact hole was provided which penetrated the planarizing layer and which electrically connected the drive TFT to a first electrode of an organic EL element.

Next, a first electrode (anode) of each pixel was formed by a sputtering method so as to be electrically connected to a TFT for driving each pixel via the contact hole provided through the planarizing layer. The first electrode is formed by lamination of Al (aluminum) having a film thickness of 150 nm and IZO (indium oxide-zinc oxide) having a film thickness of 20 nm. Next, the first electrode was patterned by a related photolithographic method into shapes each corresponding to each of RGB pixels.

In this case, the area of the first electrode was set to 300 μm×100 μm. In addition, a display portion formed on the substrate having a rectangular shape of 750 mm×220 mm had a size of 742 mm×200 mm. Along a top, a bottom, a left, and a right side of the display portion, a sealing area having a width of 2 mm was provided, and at each short side, a 2-mm terminal leading portion was further provided outside the sealing area. At the long side at which bending was performed, a 2-mm terminal leading portion was provided.

Next, a $SiO_2$ having a thickness of 200 nm was deposited on the first electrode by a sputtering method and was then patterned by a related photolithographic method so as to cover an edge portion of the first electrode. In this case, the structure was formed in which an area from each of the four sides of the first electrode to a position 10 μm inside thereof was covered with $SiO_2$, so that an edge cover was formed.

Next, the active matrix substrate was cleaned. As the cleaning for the active matrix substrate, for example, ultrasonic cleaning was performed for 10 minutes using acetone and IPA, and UV-ozone cleaning was then performed for 30 minutes.

Next, this substrate was fixed to a substrate holder in an in-line resistance heating deposition apparatus, and the pressure was reduced to $1 \times 10^{-4}$ Pa or less.

Subsequently, in a desired region, a hole injection layer having a film thickness of 100 nm was formed by a resistance heating deposition method using 1,1-bis-di-4-tolylaminophenyl-cyclohexane (TAPC) as a hole injection material.

Next, a hole transport layer having a film thickness of 40 nm was formed by a resistance heating deposition method using N,N'-di-1-naphthyl-N,N'-diphenyl-1,1'-biphenyl-1,1'-biphenyl-4,4'-diamine (NPD) as a hole transport material.

Next, a blue organic light emitting layer (thickness: 30 nm) was formed on the hole transport layer. This green light emitting layer was formed by co-deposition of 1,4-bis-triphenyl-silyl-benzene (UGH-2) (host material) and bis[(4,6-difluorophenyl)-pyridinato-N,C2']picolinateiridium(III) (Flrpic) (blue phosphorescent guest material) at deposition rates of 1.5 and 0.2 Å/sec, respectively.

Next, a hole blocking layer (thickness: 10 nm) was formed on the light emitting layer using 2,9-dimethyl-4,7-diphenyl-1,10-phenanthroline (BCP).

Next, an electron transport layer (thickness: 30 nm) was formed on the hole blocking layer using tris(8-hydroxyquinoline)aluminum ($Alq_3$).

Subsequently, a second electrode was formed. First, the substrate described above was fixed to a metal deposition chamber.

Next, a shadow mask used for second electrode formation and the substrate described above were aligned, and a magnesium-silver alloy (ratio 1:9) having a film thickness of 19 nm was formed on the surface of the electron transport layer by a vacuum deposition method. In the shadow mask, an opening is formed so as to form the second electrode in a region larger than an area including the whole light emitting region and a cathode contact area formed in advance on the substrate by 1 mm in an upper, a lower, a left, and a right side. As a result, a semi-transparent second electrode was formed.

Next, by ion plating, a protective layer of a SiON having a thickness of 100 nm was formed by patterning using a shadow mask on the semi-transparent second substrate. In this case, the film formation conditions were as follows. A plasma beam power was 4.0 kW. A beam cross section S1 was 12.56 $cm^2$. A beam energy density was 310 $W/cm^2$. A flow rate of $N_2$ was 20 sccm. A flow rate of $O_2$ was 10 sccm. A source material was a SiON sintered body, and the density thereof was set to 99% or more as a relative density.

Next, on a polyimide film having a size of 746 mm×3 mm, a blue conversion layer, a green conversion layer, and a red conversion layer, which had a film thickness of 5 μm and a plurality of stripes with a width of 0.1 mm and a pitch of 0.125 mm, were formed by a common method. Next, 64 polyimide films, each of which was described above, were arranged in parallel on a polyimide film having a size of 746 mm×200 mm used as a sealing substrate and were then adhered thereto with an adhesive thermosetting resin by heating at 80° C. for 1 hour using a hot plate.

Next, after an adhesive thermosetting resin was applied on a surface of the sealing substrate on which the color conversion layers were adhered, the surface being opposite to that on which those color conversion layers were formed, the sealing substrate was adhered to the active substrate on which the organic El was formed, and heating was performed at 80° C. for 1 hour using a hot plate, so that the resin was cured. In addition, in order to prevent degradation of the organic EL caused by moisture, the above adhesion step was performed in a dry air environment (moisture amount: −80° C.). As a result, an active drive organic EL display unit was completed.

Subsequently, three active drive organic EL display units, each of which was formed as described above, were adhered to each other in a long side direction using alignment frames. In addition, a terminal portion provided at the long side was bent in advance.

Finally, terminals formed at the short sides were each connected to a power circuit via a source driver. In addition, terminals formed at the long sides were each connected to an outside power source via a gate driver. As a result, an active drive organic EL display device having a display portion of 742 mm×600 mm was completed.

Accordingly, when a desired current was applied to each pixel by the outside power source, a desired excellent image could be obtained.

INDUSTRIAL APPLICABILITY

Even when a large display is formed by arranging many display units, gaps formed between adjacent display units can be made to be inconspicuous, and hence, high-quality display characteristics can be realized.

REFERENCE SIGNS LIST

10 organic EL display unit, 11 first substrate, 12 first electrode, 14 organic layer (organic EL layer), 15 second electrode (counter electrode), 16 second substrate (sealing substrate), 19 groove portion, 40 organic EL display device

The invention claimed is:

1. An organic EL display unit comprising:
    a first substrate;
    an organic EL element which is located on the first substrate, which includes a first electrode, an organic layer containing at least an organic light emitting layer, and a second electrode, and which is configured to emit excitation light;
    a second substrate; and
    an optical conversion layer which is located on the second substrate and which is configured to emit light to the outside through a display surface, the light being obtained by conversion of a color tone of the excitation light,
    the display surface being flat and rectangular,
    the second substrate being divided into a plurality of sections along a long side direction of the display surface,
    the second substrate being divided, above the first substrate, into the plurality of sections so as to be parallel to a seam between the organic EL display unit and an adjacent organic EL display unit.

2. The organic EL display unit according to claim 1, wherein the first substrate extends along the long side direction of the display surface and has a first end portion bent in a direction toward a surface opposite to the display surface,
    the organic EL display unit further comprising a first connection terminal portion to input a control signal of the organic EL display unit on the surface of the first end portion opposite to the display surface.

3. The organic EL display unit according to claim 1, wherein the optical conversion layer is a fluorescent substance layer performing fluorescence conversion of the excitation light.

4. The organic EL display unit according to claim 1, wherein the organic light emitting layer emits white light, and the optical conversion layer is a color filter converting a color tone of the white light.

5. The organic EL display unit according to claim 1, wherein a first connection terminal portion is formed in a region which is not overlapped with the second substrate.

6. The organic EL display unit according to claim 1, wherein the first substrate and the second substrate include a material containing a metal or a resin.

7. The organic EL display unit according to claim 1, further comprising an active matrix drive element corresponding to the organic EL element.

8. The organic EL display unit according to claim 1, further comprising a second connection terminal portion extending along a short side direction of the display surface.

9. The organic EL display unit according to claim 3,
    wherein the fluorescent substance layers are formed on the second substrate,
    the fluorescent substance layers include a red fluorescent substance layer, a green fluorescent substance layer, and a blue fluorescent substance layer, and
    the red fluorescent substance layer, the green fluorescent substance layer, and the blue fluorescent substance layer are each arranged in parallel along the long side direction of the display surface.

10. The organic EL display unit according to claim 4,
    wherein the color filters are formed on the second substrate,
    the color filters includes a red color filter, a green color filter, and a blue color filter, and
    the red color filter, the green color filter, and the blue color filter are each arranged in parallel along the long side direction of the display surface.

11. The organic EL display unit according to claim 9, wherein the first substrate is formed of an iron-nickel-based alloy having a linear expansion coefficient of 110-5/C or less.

12. The organic EL display unit according to claim 10, wherein the first substrate is formed of an iron-nickel-based alloy having a linear expansion coefficient of 110-5/C or less.

13. An organic EL display device formed of a plurality of organic EL display units, each according to claim 1, arranged along a short side direction of the display surface.

14. The organic EL display device according to claim 13, wherein a first organic EL display unit of the plurality of organic EL display units has one end portion along the long side direction of the display surface in contact with a display surface side of a second organic EL display unit adjacent to the first organic EL display unit, and another end portion of the display surface is in contact with a surface of a third organic EL display unit adjacent to the first organic EL display unit, the surface being opposite to a display surface of the third organic EL display unit.

* * * * *